(12) United States Patent
Yatsuda et al.

(10) Patent No.: US 7,656,307 B2
(45) Date of Patent: Feb. 2, 2010

(54) VEHICLE LIGHTING DEVICE AND LED LIGHT SOURCE THEREFOR

(75) Inventors: Yasushi Yatsuda, Tokyo (JP); Hisao Hirata, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 580 days.

(21) Appl. No.: 11/458,999

(22) Filed: Jul. 20, 2006

(65) Prior Publication Data

US 2007/0041185 A1    Feb. 22, 2007

(30) Foreign Application Priority Data

Jul. 20, 2005    (JP) .............................. 2005-210484

(51) Int. Cl.
G09F 9/33    (2006.01)
G08B 17/00   (2006.01)
G08B 21/00   (2006.01)

(52) U.S. Cl. .................. 340/815.45; 340/584; 340/643

(58) Field of Classification Search ............ 340/815.45, 340/815.4, 84; 362/612
See application file for complete search history.

(56) References Cited

U.S. PATENT DOCUMENTS 4,699,509 A * 10/1987 Kamiya et al. ................ 356/70
2004/0022058 A1 * 2/2004 Birrell ......................... 362/249
2004/0207532 A1 * 10/2004 Smithson ..................... 340/643
2004/0217368 A1 * 11/2004 Tian et al. ...................... 257/98
2005/0274959 A1 * 12/2005 Kim et al. ...................... 257/79
2006/0132323 A1 * 6/2006 Grady ..................... 340/815.45
2007/0131954 A1 * 6/2007 Murayama et al. ............ 257/98

* cited by examiner

*Primary Examiner*—Benjamin C Lee
*Assistant Examiner*—Andrew Bee
(74) *Attorney, Agent, or Firm*—Cermak Kenealy Vaidya & Nakajima LLP

(57) ABSTRACT

The disclosed subject matter aims to provide a vehicle lighting device and an LED light source therefore. Accurate temperature detection of an LED chip and associated phosphor can be monitored in real time. The LED light source can include at least one LED chip mounted on a base and a phosphor layer disposed adjacent the LED chip. A mixed particulate phosphor for generating fluorescence through light emitted from the above LED chip can also be provided. The LED light source can be configured to output mixed color light containing the light from the LED chip and the fluorescence from the phosphor. The LED light source can also include a temperature detecting element located on the base and LED chip to detect the temperature on the periphery of the LED chip.

19 Claims, 11 Drawing Sheets

VEHICLE LIGHTING DEVICE AND LED LIGHT SOURCE THEREFOR

This application claims the priority benefit under 35 U.S.C. § 119 of Japanese Patent Application No. 2005-210484 filed on Jul. 20, 2005, which is hereby incorporated in its entirety by reference.

BACKGROUND

1. Technical Field

The disclosed subject matter relates to a light emitting diode (LED) light source for a vehicle lighting device, for example, to be used as a headlight, an auxiliary light, spotlight, traffic light, etc. for a vehicle or other application, and a vehicle lighting device using the above LED light source.

2. Related Art

Conventionally, such an LED light source is configured, for example, as shown in FIG. 9. Namely, in FIG. 9, an LED light source 1 includes at least one LED chip 3 (in the case shown in the figure, four LED chips) placed on a base 2, a reflector 4 disposed on the base 2 so as to surround the LED chip(s) 3, and a phosphor layer 5 filled in a hollow 4a of the reflector 4.

The above base 2 is formed of an insulating material having satisfactory thermal conductivity, such as copper, ceramic (AlN, alumina $Al_2O_3$) and silicon (Si).

Each LED chip 3 is mounted on a chip mounting portion having a conductive pattern formed on the base 2 by means of die bonding, etc., and electrically connected to an adjacent connection portion of a similar conductive pattern with a bonding wire 3a.

The reflector 4 is configured such that at least the internal face of the hollow 4a thereof has a light-shielding property. The hollow 4a of the reflector 4 vertically penetrates so as to surround the entire LED chips 3 on the periphery thereof.

Here, the reflector 4 is configured such that the internal face of the hollow 4a thereof constitutes a reflecting face.

The phosphor layer 5 is formed of a light-transparent material of, for example, silicone, and has a particulate phosphor (not shown) mixed therein, so as to be dispersed substantially uniformly.

Here, the phosphor is excited by light emitted from each of the above-mentioned LED chips 3, and generates fluorescence having a different wavelength as compared to that emitted by the LED chips 3.

Here, the above LED chip 3 and the phosphor are used with the following combinations.

Namely, for example, to obtain white light, a blue LED chip can be used for outputting blue light, and a phosphor can be used for generating yellow light by means of excitation by the blue light from the blue LED chip. Color mixing of the blue color light from the LED chip with the yellow color light from the phosphor occurs and white light can be obtained in a simulated manner.

Similarly, to obtain white light, an ultraviolet LED chip can be used for outputting ultraviolet light, and an RGB phosphor can be used for generating substantially visible white light triggered by the ultraviolet light emitted from the ultraviolet LED chip.

According to the LED light source 1 having the aforementioned structure, the light output from the LED chip 3 is output toward the upper direction via the phosphor layer 5, either directly or after being reflected on the internal wall of the reflector 4.

At this time, for example, when blue light output from the LED chip 3 hits the phosphor in the phosphor layer 5, the phosphor absorbs the blue light, and generates yellow light as fluorescence through wavelength conversion. Then, color mixing of the yellow light with the blue light from the LED chip 3 occurs and white light is output in a simulated manner.

As the output becomes high in the LED light source 1 having the above-mentioned structure, a large current of the order of a few hundred MA flows in the LED chip 3. Thus, a large amount of heat generation occurs.

Among the power input to the LED chip, approximately 85% is converted to heat, and the efficiencies of both the LED chip 3 and the phosphor tend to degrade as the temperature rises. Therefore, it is helpful to efficiently radiate the generated heat to the outside.

In particular, the phosphor has a marked efficiency degradation caused by the temperature rise. For example, when the temperature rises by 50° C. from 50° C. to 100° C., in general, the fluorescence conversion efficiency thereof is decreased by 10% or more.

Further, as described above, because the phosphor surrounds the LED chip 3 in a state including silicone, etc. having a relatively low coefficient of thermal conductivity in the phosphor layer 5, the heat is apt to be confined internally. Also, because the phosphor generates heat by absorbing the light, the phosphor tends to have a higher temperature than the LED chip 3.

Therefore, in the LED light source 1 that outputs white light, for example, as shown in FIG. 10, as the temperature rises, the blue light (peak A) from the LED chip 3 is reduced, and also the yellow light (peak B) from the phosphor is reduced to a larger extent.

Accordingly, as shown in FIG. 11, with the increase of temperature, the chromaticity greatly deviates, for example, from the area of "ECE No. 99" shown by the symbol D, although staying, for example, in "an SAE white area" shown by the symbol C.

In contrast, increased output LED light sources have been considered for utilization in a variety of fields, and in some cases have already been put into practical use. A vehicle headlight for an automobile is one such use.

In the case of the automobile headlight, a lot of heat generation occurs as a result of the engine heat. Accordingly, the temperature in the ambient circumstance for the vehicle headlight may be extremely high. For example, at an idling time, the ambient temperature may reach 70° C., or even higher.

When using a white-light LED light source that produces a high output in such an ambient circumstance, the temperature of the LED chip 3 may exceed 100° C. Accordingly, the LED light source 1 can itself be configured as a low heat-resistance package, and can be combined together with a structure enabling larger heat radiation, such as a heat sink.

For example, when the heat resistance of the package of the LED light source 1 is 3° C./W, the heat resistance of the heat sink is 5° C./W, and the power consumption of a single LED light source 1 is 5 W, then, the temperature of the LED chip 3 rises by 35° C. to the external air temperature. Therefore, when the ambient temperature of the vehicle headlight is 70° C., the temperature of the LED chip 3 becomes 105° C., and the phosphor temperature can exceed 120° C.

Thus, when efficiency is degraded due to the temperature rise, the energy not converted to light is converted to heat, which causes a further increase in the heat generation amount, resulting in a further rise of temperature and further degradation.

To cope with the above problem, Japanese Patent Application Laid-open No. 2000-261039 (the JP'039 publication) discloses a light source device in which the heat generated by an LED chip is radiated to the outside via an electrode extending to the external surface of a substrate.

Now, according to the light source device disclosed in the JP'039 publication, it is not possible to perform sufficient radiation when the ambient temperature is high, and accordingly, it is not possible to efficiently radiate the heat generated by the LED chip.

To solve the above problem(s), it is effective to set an optimal drive current value for the LED chip, based on the temperature of the LED chip or the phosphor. Conventionally, the drive control of the LED chip has been performed by measuring the ambient temperature of an LED light source package using a temperature sensor, etc.

However, the ambient temperature of the LED light source package has a time lag as compared to the temperatures of the LED chip and the phosphor. Since the temperatures of the LED chip and the phosphor have not been measured accurately in real time, it has been difficult to drive the LED chip with an optimal drive current value. As a result, the temperatures of the LED chip and the phosphor further rise, which results in a vicious circle of further efficiency degradation.

Moreover, conventionally, based on a reference heat resistance value of a standard package, the temperature of the LED chip or the phosphor, a heat source, is estimated by detecting an ambient package temperature, a heat sink temperature, or the like. However, there may be cases in which the estimated temperature greatly differs from the actual temperature because the heat resistance of the package greatly differs among the packages of the same structure, depending on the junction conditions of the LED chip and the package. Therefore, it has been difficult to detect the temperatures of the LED chip and the phosphor with accuracy.

Also, it has been required to manage the phosphor temperature for efficient utilization of the LED using the phosphor.

SUMMARY

In consideration of the above points as well as other considerations, a technique related to an LED can be provided to securely detect a phosphor temperature with accuracy.

According to an exemplary embodiment of the disclosed subject matter, an LED light source can include at least one LED chip mounted on a base and a phosphor layer disposed so as to surround the LED chip, the phosphor layer having a particulate phosphor mixed therein for generating fluorescence by means of the light from the LED chip. Thus, the LED light source can output a mixed color light containing the light from the LED chip and the fluorescence emitted from the phosphor. The LED light source can also include a temperature detecting element mounted on the base adjacent to the LED chip such that the ambient temperature of the LED chip is detected by the temperature detecting element.

In a LED light source for a vehicle lamp according to the disclosed subject matter, the temperature detecting element can be disposed on the base and in the phosphor layer.

Alternatively, the temperature detecting element can be disposed on the base and outside the phosphor layer, and/or disposed adjacent or spaced from the base.

In a LED light source for a vehicle lamp according to the disclosed subject matter, the LED chip and the temperature detecting element can be driven by mutually different drive currents, via two-system wiring patterns formed on the base surface.

In a LED light source for the vehicle headlight according to the disclosed subject matter, the base can be formed of an insulating material having a high coefficient of thermal conductivity including a ceramic or silicon.

In a LED light source for the vehicle headlight according to the disclosed subject matter, the base can alternatively be formed of a metal material having satisfactory thermal conductivity including copper and aluminum, and can have a submount bonded thereon being formed of an insulating material of a high coefficient of thermal conductivity, including silicon and ceramic. A wiring pattern can be formed on the surface of the base.

In a LED light source for a vehicle lamp made in accordance with principles of the disclosed subject matter, the temperature detecting element can be a miniaturized chip-type thermistor or a thermal diode.

Alternatively, the temperature detecting element can be a second LED chip of a size that is smaller than the main LED chip. The temperature characteristic of the second LED chip is known, and by supplying a minute current to the second LED chip, the temperature can be detected based on the variation of the voltage value thereof.

Further, according to another exemplary embodiment of the disclosed subject matter, a vehicle lighting device can include at least one of the aforementioned LED light sources and a drive control section for driving the LED light source. The above drive control section can be configured to detect a temperature in the vicinity of the LED light source by means of the above temperature detecting element.

In a vehicle lighting device according to the disclosed subject matter, the drive control section can be configured to adjust the drive current fed to each LED chip of the LED light source, based on the temperature in the vicinity of the LED light source detected by the temperature detecting element.

In a vehicle lighting device according to the disclosed subject matter, the drive control section can be configured to detect temperature abnormality, based on the temperature in the vicinity of the LED light source that is detected by the temperature detecting element.

The drive control section can include an alarm section that provides an external notification when a temperature abnormality is detected.

According to the above configuration, the light output from the LED chip is incident on the phosphor layer, and a portion thereof is absorbed by the phosphor material. The phosphor then emits fluorescence having a different color via wavelength conversion from the incident light. Then, as a result of color mixing of the above fluorescence with the light from the LED chip, mixed color light is output.

Because the temperature detecting element is mounted on the base and adjacent to the LED chip it is possible to detect the ambient temperature of the LED chip by means of the temperature detecting element.

Accordingly, when the LED chip is driven, heat is generated in the LED chip and successively in the phosphor of the phosphor layer. When the temperatures of the LED chip and the phosphor layer rise, the temperatures thereof can be detected with accuracy in substantially real time by means of the temperature detecting element described above.

Further, because the temperature detecting element is mounted on the base, the LED light source does not become larger in size as compared to the conventional case when an external temperature sensor is provided.

Also, because the above temperature detecting element actually detects the temperature in the vicinity of the LED chip inside the LED light source package, it becomes possible to accurately detect the temperature without affects due to the dispersion in the heat resistance package.

In the case that the temperature detecting element is disposed inside the phosphor layer on the base, the temperature detecting element can directly detect the temperature of the phosphor layer. Thus, the temperature of the phosphor layer, which tends to become higher, can be detected with accuracy in substantially real time.

In the case that the temperature detecting element is disposed outside the phosphor layer on the base, the temperature detecting element detects the ambient temperature of the LED chip directly. Thus, the ambient temperature of the LED chip can be detected with accuracy in substantially real time.

The LED chip and the temperature detecting element can be driven by mutually different drive currents via two-system wiring patterns formed on the base surface. In this case, an extremely minute current can be used to detect temperature via current flow in the temperature detecting element. Specifically, the temperature can be detected by the variation in a resistance value or a forward voltage value, thus restraining heat generation in the temperature detecting element to a certain extent.

The base can be formed of an insulating material having a high coefficient of thermal conductivity such as a ceramic or silicon, and the heat generated in the LED chip and the phosphor can be radiated to the outside, via the base.

As indicated above, the base can also be formed of a metal material having satisfactory thermal conductivity, such as copper and aluminum. A sub-mount can be bonded thereon, and formed of an insulating material having a high coefficient of thermal conductivity, including silicon or ceramic. A wiring pattern can also be formed on the surface of the base. In this case, the heat generated in the LED chip and the phosphor can be radiated to the outside, via the base.

In the case that the temperature detecting element is a miniaturized chip-type thermistor or a thermal diode, the temperature detection can easily be performed via a structure with a simple configuration, and at low cost.

As indicated above, the temperature detecting element can also be formed as a second LED chip of smaller size than the main LED chip, and can have a temperature characteristic that is known. By supplying a minute current to the second LED chip, the temperature is detected based on the variation of a voltage value applied to the second LED chip. The second LED chip can be mounted on the base simultaneously when mounting the LED chip on the base. Therefore, no additional or extra assembly process is incurred when the temperature detecting element is mounted.

Each LED light source can be configured to emit light via a drive control located in a drive control section. Light is irradiated, for example, toward a forward direction of an automobile. In this case, in each LED light source, because the temperature detecting element is mounted on the base adjacent to the LED chip, the ambient temperature of the LED chip can be detected by one of the above-described temperature detecting elements.

Accordingly, when the LED chip is driven heat is generated in both the LED chip and then in the phosphor of the phosphor layer, causing a temperature rise in the LED chip and the phosphor layer. The temperature thereof can be detected with accuracy in substantially real time by means of the above-described temperature detecting elements. Further, when the temperature detecting element is mounted on the base, the entire LED light source is not necessarily larger in size, as compared to the conventional case when a temperature sensor is externally provided.

The drive control section can be configured to adjust the drive current to flow in each LED chip of the LED light source at an optimal value based on the temperature in the vicinity of the LED light source detected by the temperature detecting element. The drive current supplied to each LED chip can be adjusted to the optimal value by the drive control section. Thus, a rise of temperature in both the LED light source and the phosphor layer can be restrained.

The drive control section can detect a temperature abnormality based on the temperature in the vicinity of the LED light source that is detected by the temperature detecting element. The abnormality can be detected by the drive control section by detecting when the temperatures of the LED chip and the phosphor layer reach predetermined temperatures set in advance.

The drive control section can include an alarm section for notifying an operator or other device of the abnormality. Thus, it is possible to suspend or diminish the use of the LED light source or the vehicle lighting device, if necessary.

As such, in the LED light source and the vehicle lighting device according to the disclosed subject matter, when outputting mixed color light containing the light output from the LED chip and the fluorescence output from the phosphor, the temperature rise caused by the heat generated by the LED chip and the phosphor can be detected with accuracy in substantially real time, by means of the temperature detecting element.

By incorporating the temperature detecting element in the LED light source package, the LED light source can be minimized in size.

DESCRIPTION OF EXEMPLARY EMBODIMENTS

Hereinafter, some exemplary embodiments of the disclosed subject matter will be described in detail, referring to FIGS. 1 through 8.

Here, in the embodiments described below, a variety of technical features are included. However, the scope of the disclosed subject matter is not limited thereto.

Figure 1:
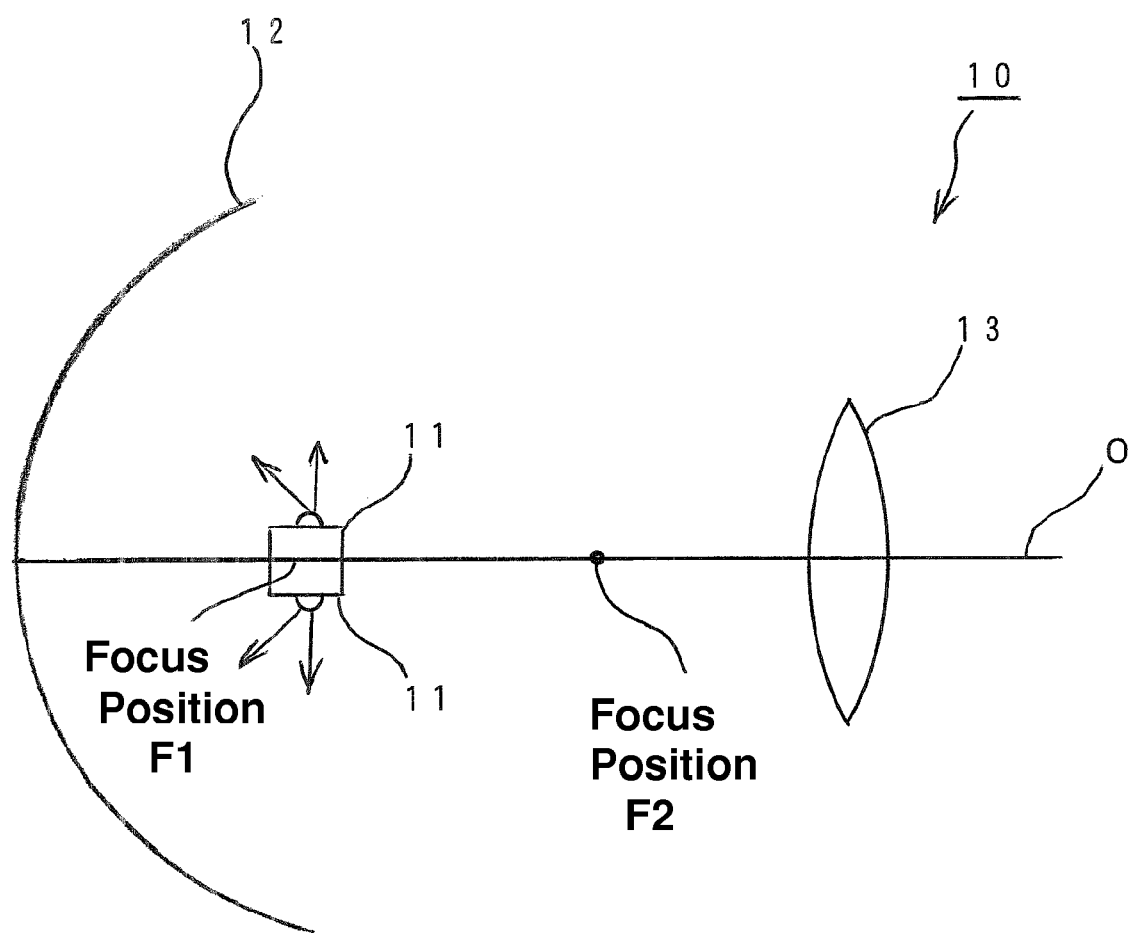
FIG. 1 shows a schematic perspective view illustrating the configuration of an embodiment of a vehicle lighting device in accordance with principles of the disclosed subject matter.

FIG. 1 shows the configuration of an embodiment of a vehicle lighting device made in accordance with principles of the disclosed subject matter. A vehicle lighting device 10 can include at least one LED light source 11 (in the figure, two LED light sources 11 are shown), a reflecting face 12 for reflecting the light from each LED light source 11 toward a forward direction along an optical axis O, and a projection lens 13 disposed in the forward direction of the reflecting face 12.

The LED light sources 11 can be disposed back to back along the optical axis O. As described later, a plurality of LED chips can be arranged perpendicular to the optical axis O in each LED light source 11.

The reflecting face 12 can have a concave shape of, for example, an ellipsoid of revolution facing toward the forward direction. The reflecting face 12 can be disposed in such a way that the optical axis thereof extends to the forward direction, and a first focus position F1 coincides with the vicinity of the emission center of the LED light source 11. The light output from the LED light source 11 and incident to the reflecting face 12 is reflected on the reflecting face 12, and can be forwarded to a second focus position F2 convergently.

The projection lens 13 can be a convex lens formed of a light-transparent material of, for example, glass and/or plastic. The projection lens 13 can be disposed in such a way that the focus position on the rear side is located in the vicinity of the second focus position of the reflecting face 12. The direct light from the LED light source 11 and/or the reflecting light from the reflecting face 12 is transmitted forward by the projection lens 13 so as to form substantially parallel light.

Figure 2:
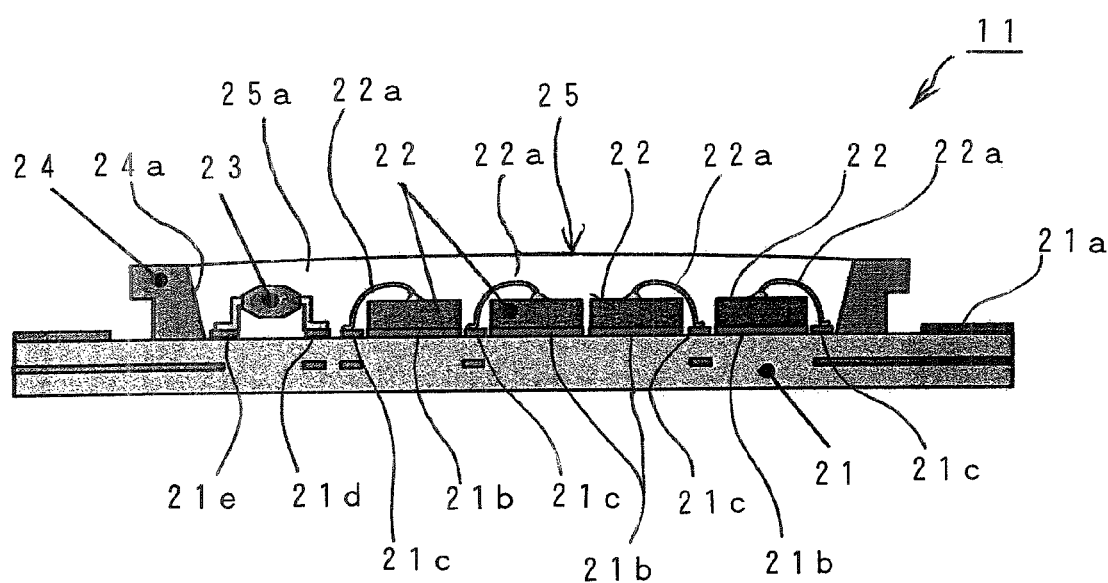
FIG. 2 is a cross sectional view illustrating an embodiment of each LED light source for the vehicle lighting device as shown in FIG. 1.

The above-mentioned LED light source 11 can be configured as shown in FIG. 2, which shows an exemplary embodiment of a LED light source 11 made in accordance with principles of the disclosed subject matter. The LED light source 11 can include at least one LED chip 22 (in the figure, four) placed on a base 21, a temperature sensor 23 similarly placed on the base 21 adjacent to the above LED chips 22, a reflector 24 disposed on the base 21 so as to surround both the LED chips 22 and the temperature sensor 23, and a phosphor layer 25 filled in a hollow 24a of the reflector 24.

The base 21 can be formed of an insulating material having high thermal conductivity, for example, copper, ceramic (AlN, alumina) and/or silicon (Si). On the surface of the base 21, a conductive pattern 21a made from a conductive material such as copper or gold can be formed.

Each LED chip 22 can be mounted on a chip mounting portion 21b having a conductive pattern formed on the base 21 by means of die bonding, etc., and electrically connected to an adjacent connection portion 21c of a similar conductive pattern, by means of a bonding wire 22a. Here, as an example, the LED chip 22 can be a blue LED chip of InGaN.

The temperature sensor 23 can be a chip-type temperature sensor, for example, a chip-type thermistor or a thermal diode, which is surface-mounted onto the connection portions 21d, 21e of conductive patterns formed on the base 21.

The reflector 24 can be configured such that at least the internal face of the hollow 24a thereof has a light-shielding property. The hollow 24a of the reflector 24 vertically penetrates into the reflector 24 so as to surround the periphery of the LED chips 22 and the temperature sensor 23. The reflector 24 can also be configured such that the internal face of the hollow 24a thereof constitutes a reflecting face.

The phosphor layer 25 can be formed of a light-transparent material of, for example, silicone. In the phosphor layer 25, particulate phosphors 25a or other types of wavelength conversion materials can be mixed soas to be dispersed substantially uniformly.

Here, the phosphor 25a is excited by the blue light from each of the above-mentioned LED chips 22, to generate fluorescence having a different wavelength, namely yellow fluorescence.

Simulated white light is obtained by mixing colors of the blue light from the LED chip 22 with the yellow light from the phosphor 25a.

Figure 3:
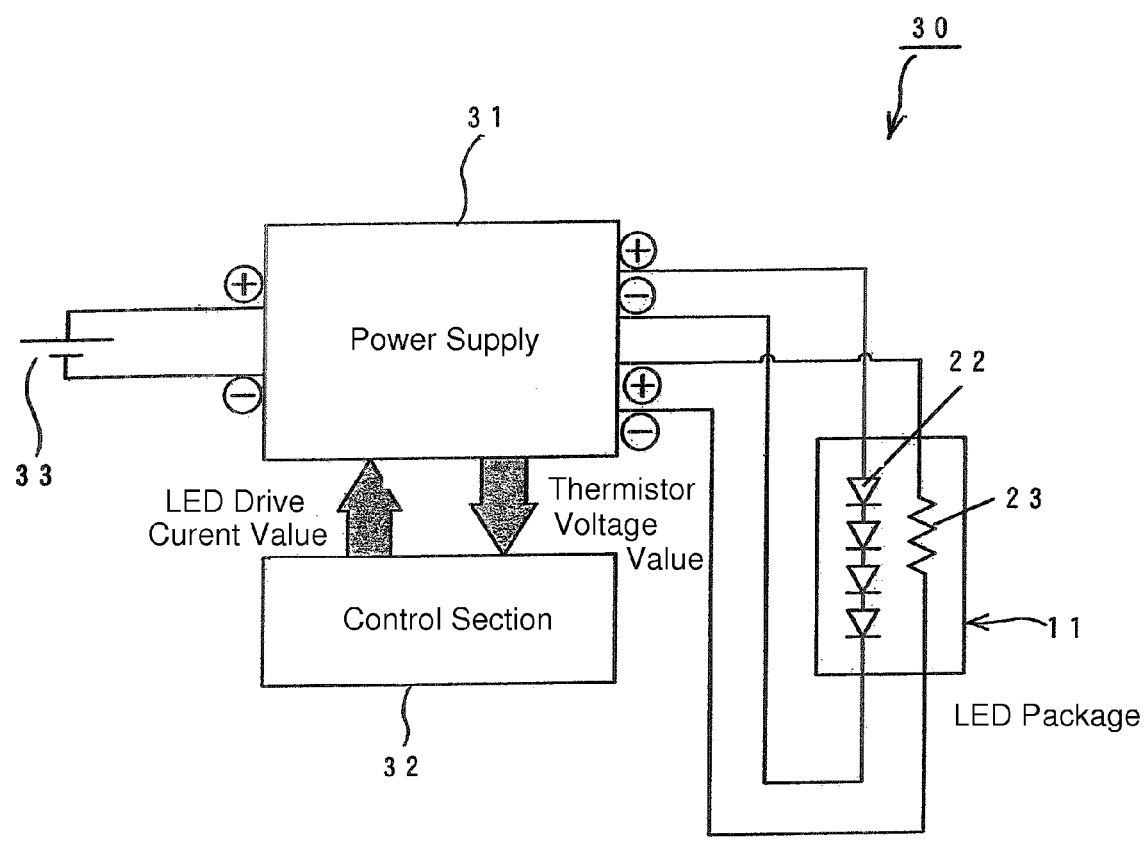
FIG. 3 is a block diagram illustrating an example of a drive control section/circuit for driving the LED light source shown in FIG. 2.

FIG. 3 is a circuit illustration that shows an example of a drive control section for controlling current to drive the above-mentioned LED light source(s) 11.

In FIG. 3, a drive control section 30 includes a power supply circuit 31 for feeding power to an LED light source 11 (only one light source 11 is shown for the sake of simplification), and a control section 32 for controlling the power supply circuit 31.

The power supply circuit 31 supplies voltage from a battery 33 independently to the LED chips 22 and the temperature sensor 23.

The control section 32 controls a drive current to be supplied to each LED chip 22, based on a voltage value corresponding to the temperature determined by the temperature sensor 23.

Also, the control section 32 controls a drive current supplied to the temperature sensor 23 to provide an extremely minute current as compared to the current for the main LED chip 22.

Thus, the temperature sensor 23 can be driven with the use of a small amount of power consumption, which would be different from the case in which the sensor 23 was connected in series with the LED chip 22. With this low power connection, the heat generation in the temperature sensor 23 is reduced/minimized, and accordingly, a rise in the temperature of the entire reflecting face 12 (and the phosphor) can be avoided.

Additionally, when a temperature abnormality occurs, it may be possible to configure the control section 32 to issue an alarm from an alarm section, which is incorporated or attached outside. This can be accomplished by detecting the temperature abnormality when the temperature of the phosphor layer 25 detected by the temperature sensor 23 becomes higher than a predetermined temperature that is set in advance.

The vehicle lighting device 10 can be configured as described above. By driving each LED chip 22 of the LED light source 11 from the drive control section 30, blue light can be emitted from the LED chip 22 and incident on the phosphor 25a inside the phosphor layer 25. Thus, yellow fluorescence is generated from the phosphor 25a.

Accordingly, as a result of color mixing in which the blue light emitted from the LED chip 22 mixes with the yellow light from the phosphor 25a, white light is produced in a simulated manner. The white light emits from the surface of the phosphor layer 25 to the forward direction (the upper direction in FIG. 2).

Thus, the white light is output from each LED light source 11 and reflected at the reflecting face 12, and further converged by the projection lens 13. Consequently, the white light irradiates a predetermined lighting area located in the forward direction.

Here, by making an extremely minute current flow by means of the drive control section 30, the above temperature sensor 23 is driven, and the resistance value or the forward voltage value thereof varies depending on the ambient temperature.

Then, by detecting the above voltage value by the control section 32 via the power supply circuit 31, the above control section 32 detects the ambient temperature of the LED chip 22, in particular, the temperature of the phosphor layer 25.

When the above detected temperature becomes higher than a preset temperature, the control section 32 adjusts the drive current to the LED chip 22 to a lower value, and thereby an increase in the temperature of the above LED chip 22 can be suppressed, and the degradation of the emission efficiency of the LED chip 22 caused by the temperature rise can also be suppressed.

Figure 4:
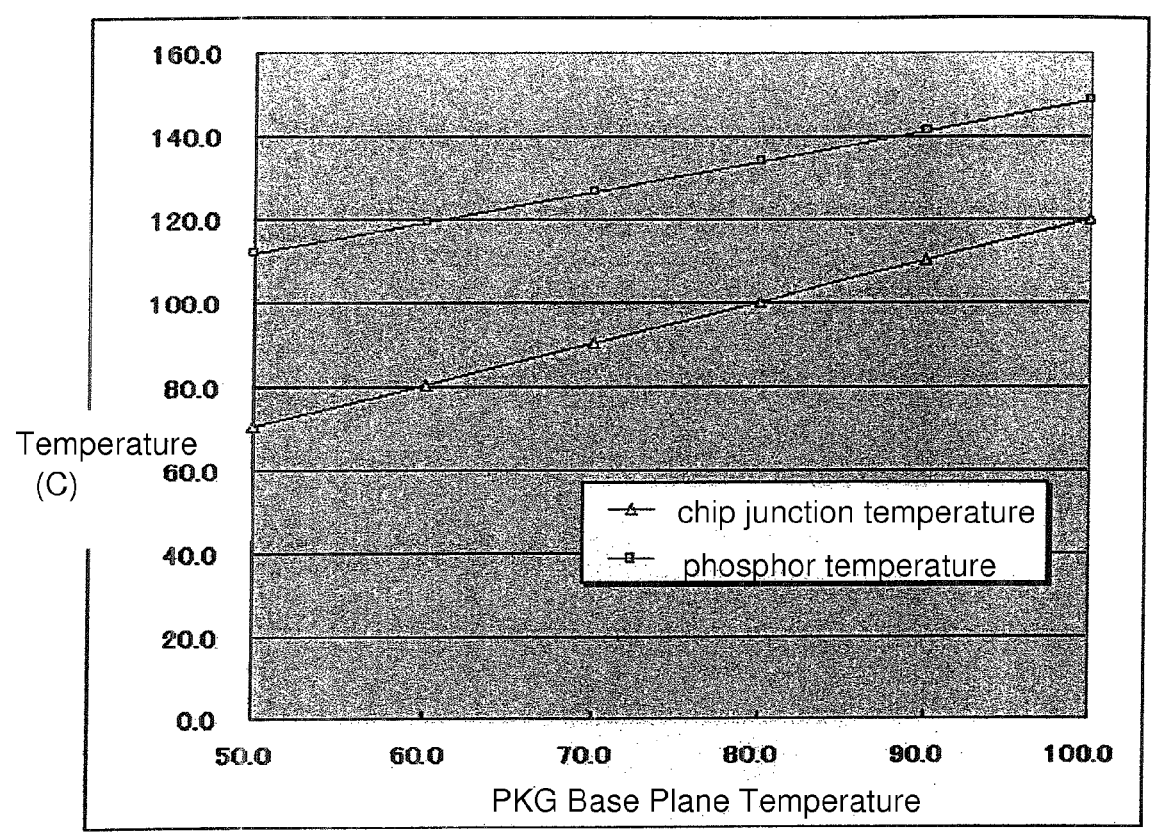
FIG. 4 is a graph illustrating the relationship of a chip junction temperature and a phosphor layer temperature compared to the temperature of a package base plane for the LED light source shown in FIG. 2.

The junction temperature of the LED chip 22 and the temperature of the phosphor layer 25 to the package base plane temperature in the LED light source 11 are as shown by the graph in FIG. 4. From the graph, it is understood that the temperature of the phosphor layer 25 is approximately 30° C. higher than the junction temperature.

In conventional temperature detection that occurs by means of an electrode, the above junction temperature can be detected. However, in the LED light source 11 according to the embodiment of the disclosed subject matter, since the temperature of the phosphor layer 25 can be detected directly, more accurate temperature management can be attained.

Figure 5:
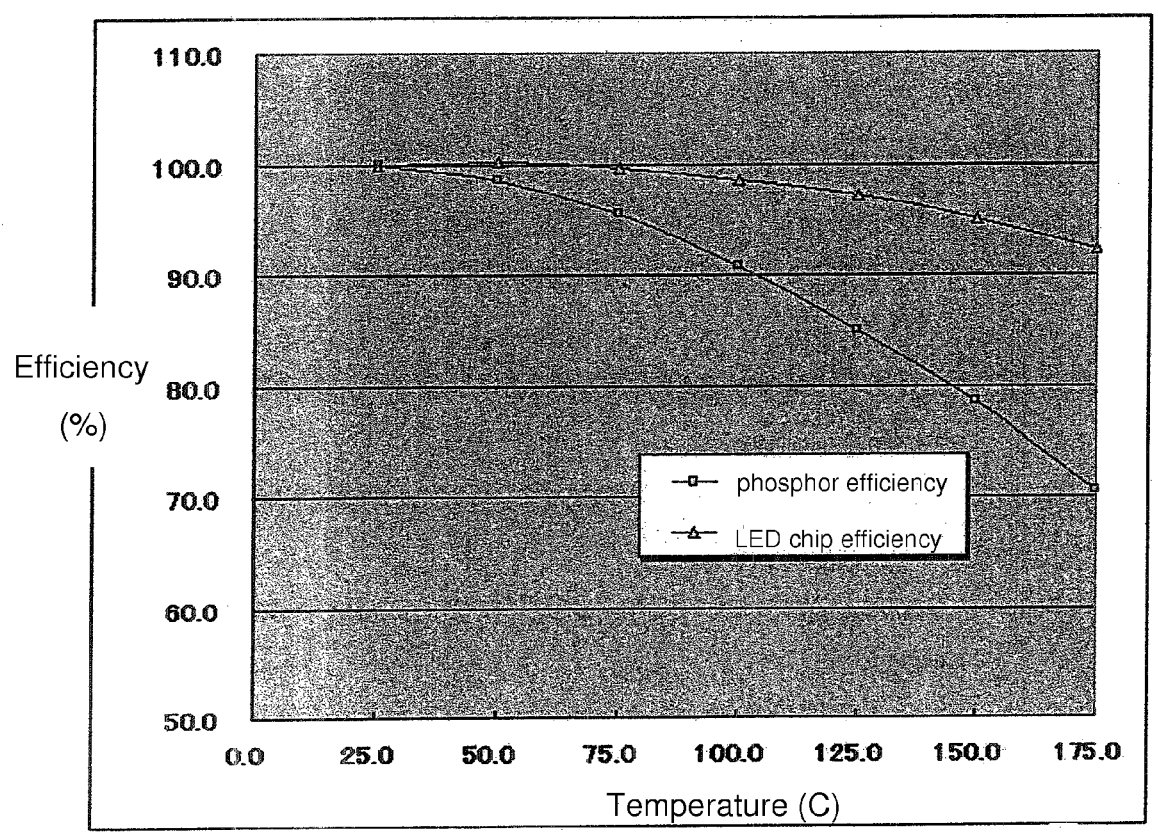
FIG. 5 is a graph illustrating the emission efficiency of the LED chip and the conversion efficiency of the phosphor, depending on the temperature of a LED light source as shown in FIG. 2.

Also, when the emission efficiency of the LED light source 11 at 25° C. is 100%, the efficiencies of the LED chip 22 and the phosphor 25a as compared to the temperature are as shown by the graph in FIG. 5. For example, at 150° C., the LED chip 22 holds an emission efficiency on approximately 95%. By contrast, the conversion efficiency of the phosphor 25a is degraded to approximately 80%.

Accordingly, by performing drive control of the LED chip 22 from the control section 32 and suppressing the temperature rise, it is understood that the conversion efficiency of the phosphor 25a can be maintained at approximately 90% by suppressing the temperature of the phosphor 25a, for example, to approximately 100° C.

Figure 6:
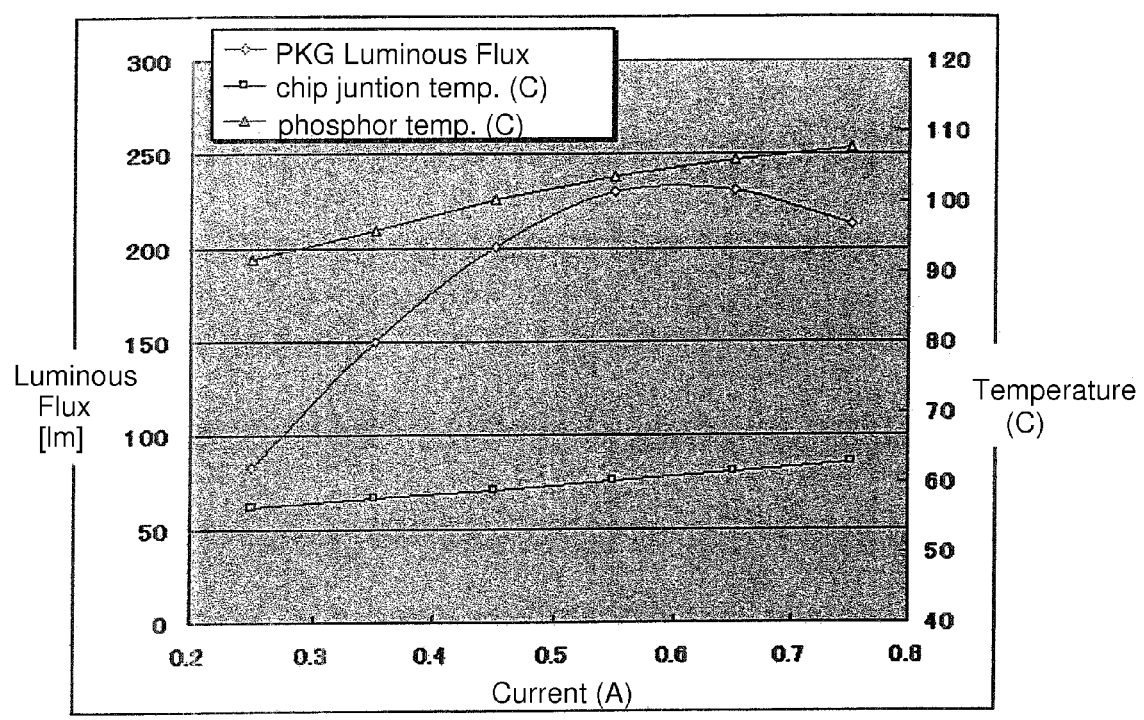
FIG. 6 is a graph illustrating a chip junction temperature, a phosphor temperature and a light flux compared to a drive current when the package base plane temperature of a LED light source as shown in FIG. 2 is constant at 50° C.

Further, when the package temperature of the above LED light source 11 is controlled to be constant at 50° C., the luminous flux, the junction temperature and the temperature of the phosphor 25a compared to the drive current If, are as shown by the graph in FIG. 6. When the temperature of the phosphor 25a exceeds 100° C., the luminous flux does not increase even when the drive current If increases. The reason is considered to be that the conversion efficiency of the phosphor 25a is extremely degraded when the temperature exceeds 100° C.

Accordingly, in a similar way, by performing drive control of the LED chip 22 from the control section 32 and suppressing the temperature rise, it is understood that the temperature of the phosphor 25a can be suppressed to approximately 100° C.

As such, according to the vehicle lighting device 10 that incorporates the temperature sensor 23 inside the package of the LED light source 11, and thereby directly detects the temperature of the phosphor layer 25, the temperature of the phosphor 25a can be accurately detected in substantially real time. By performing drive control of the LED chip 22 based on the detected temperature, a temperature rise in the LED chip 22 can be suppressed.

Figure 7:
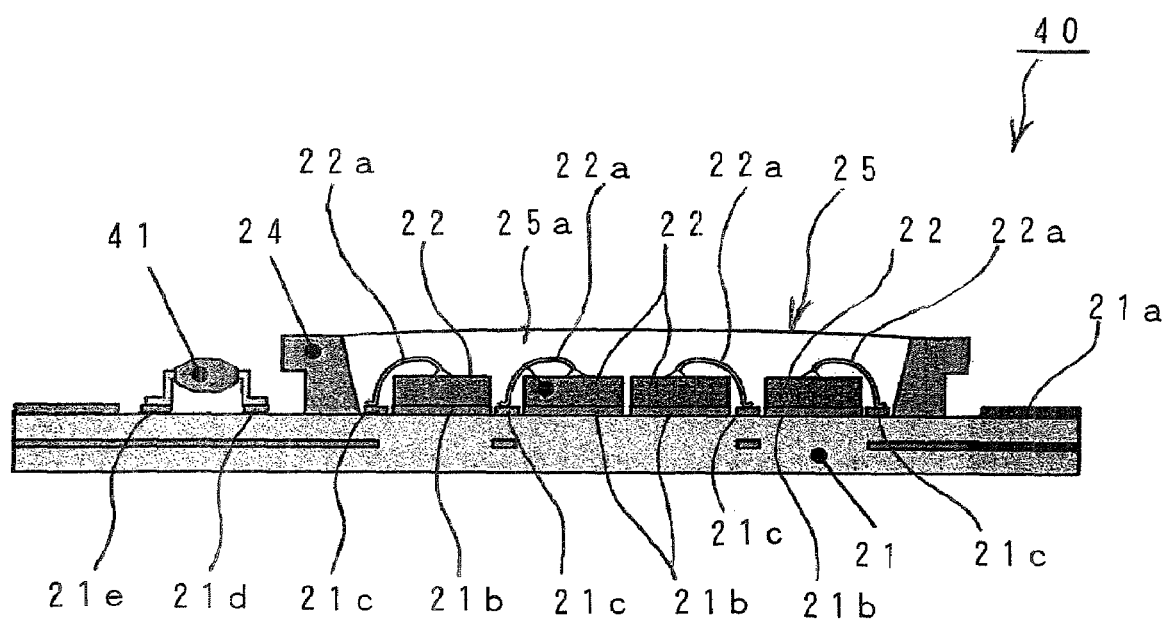
FIG. 7 is a cross section view illustrating the configuration of another embodiment of a LED light source made in accordance with principles of the disclosed subject matter.

FIG. 7 shows the configuration of another embodiment of a LED light source according to the disclosed subject matter.

In FIG. 7, an LED light source 40 has substantially the same configuration as the LED light source 11 shown in FIG. 2. Therefore, the same or similar elements are referred to by like symbols, and the description thereof is omitted.

The LED light source 40 has a different configuration from the LED light source 11 shown in FIG. 2 in that, in place of the temperature sensor 23 on the base 21, a temperature sensor 41 is mounted outside the reflector 24, namely, outside the phosphor layer 25.

In this case, the temperature sensor 41 can be disposed within 3 mm from the nearest LED chip 22.

Accordingly, the LED light source 40 can function similar to the LED light source 11 shown in FIG. 2, and also, the temperature sensor 41 can detect the peripheral temperature of the LED chip 22.

When the temperature sensor 41 is disposed within 3 mm from the nearest LED chip 22, the temperature sensor 41 can detect the peripheral temperature of the LED chip 22 more accurately, namely, the temperature of the LED chip 22 more accurately.

Accordingly, by using the control section 32 to adjust the drive current to the LED chip 22 to an optimal value based on the detected temperature, the temperature rise of the LED chip 22 can be suppressed. In addition, degradation in the emission efficiency of the LED chip 22 caused by temperature rise can be suppressed.

Figure 8:
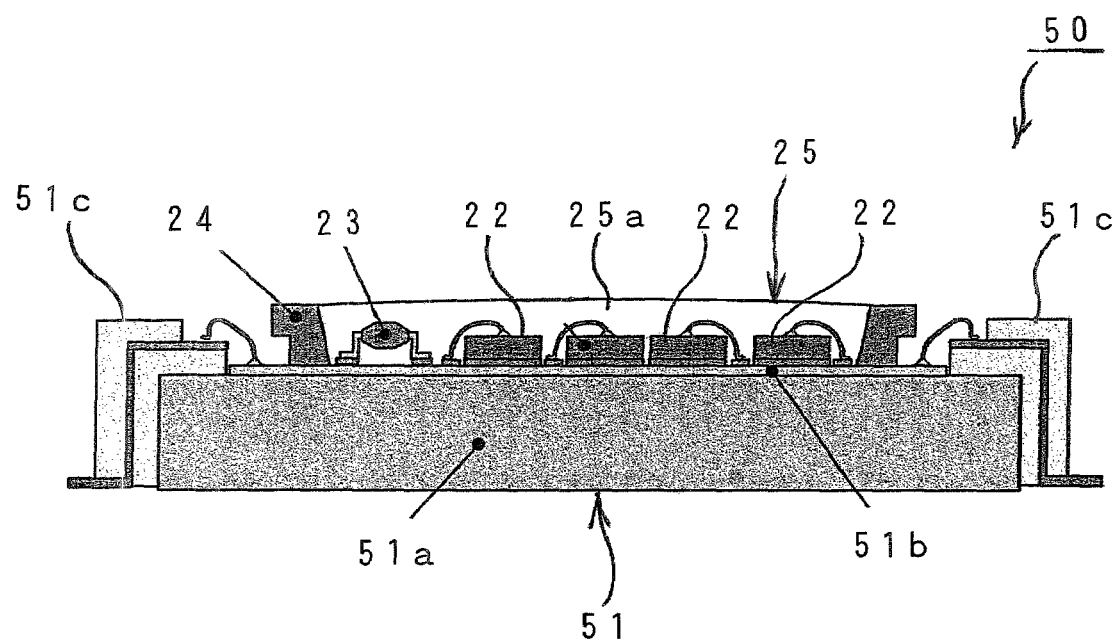
FIG. 8 is a cross section view illustrating the configuration of another embodiment of a LED light source made in accordance with principles of the disclosed subject matter.
Figure 9:
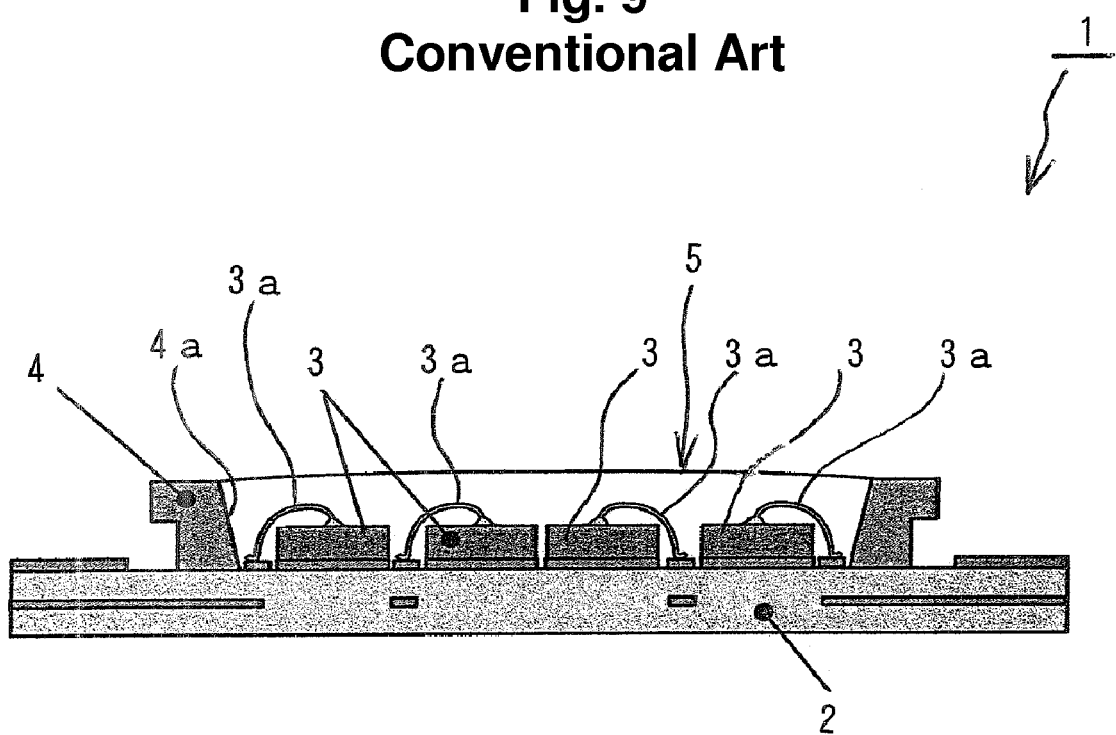
FIG. 9 is a cross section view illustrating an exemplary configuration of a conventional white LED light source.
Figure 10:
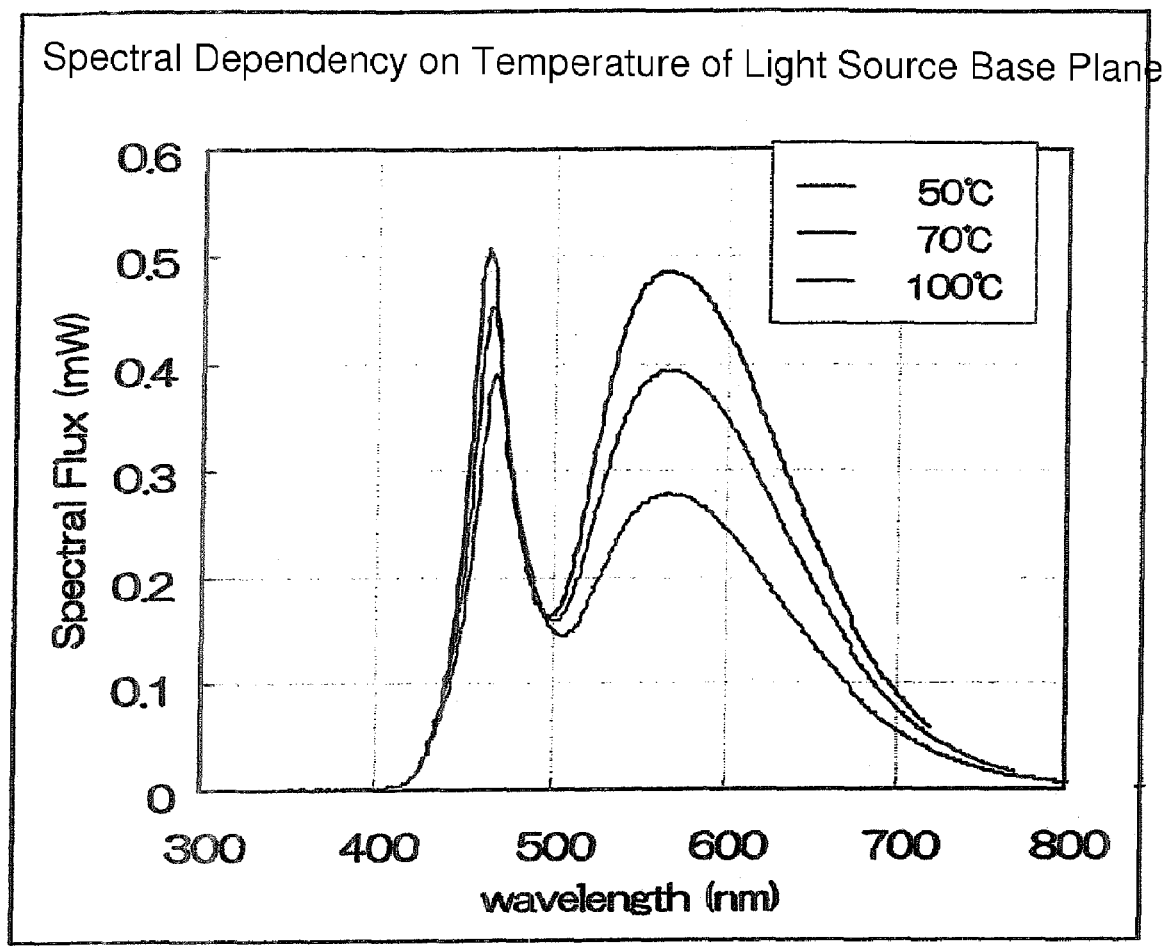
FIG. 10 is a graph illustrating the spectral dependency of the output light on the package base plane temperature in the white LED light source shown in FIG. 9.
Figure 11:
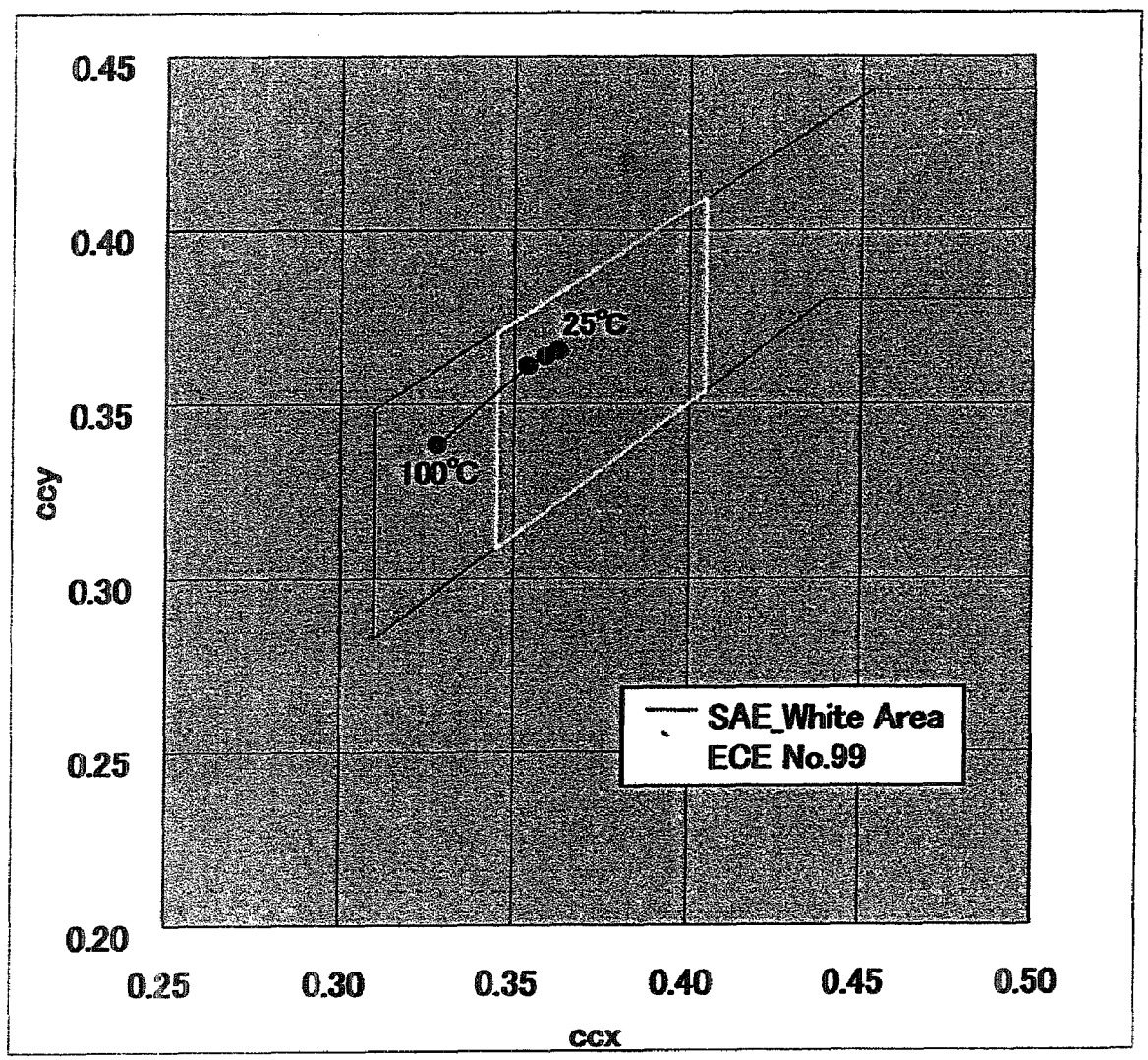
FIG. 11 is a graph illustrating a deviation of chromaticity to the package base plane temperature in the white LED light source shown in FIG. 9.

FIG. 8 shows another embodiment of an LED light source according to the disclosed subject matter.

In FIG. 8, an LED light source 50 can have substantially the same configuration as the LED light source 11 shown in FIG. 2. Therefore, the same or similar elements are referred to by like symbols, and the description thereof is omitted.

The LED light source 50 has a different configuration from the LED light source 11 shown in FIG. 2 at least in that a base 51 is provided in place of the base 21.

In this case, the base 51 includes a block 51a that can be formed of a metal material having high thermal conductivity, such as copper and/or aluminum, and a submount 51b can be bonded on the upper face of the block 51a. The submount 51b can include a thin film of insulating material having high thermal conductivity, such as copper, ceramic (AlN, alumina) and/or silicon (Si). On the surface thereof, the conductive pattern 21a of copper, gold, etc. can be formed. Further, the LED chip 22 and the temperature sensor 23 can be mounted on the submount 51b, and the reflector 24 can also be placed on the submount 51b, if desired.

Here, the conductive pattern 21a on the submount 51b is configured such that it leads to the vicinity of the lower face of the base 51 via a connection portion 51c that is disposed on the end edge or the side edge of the block 51a.

The LED light source 50 can function similar to the LED light source 11 shown in FIG. 2, and can also be configured as a so-called submount system.

In the aforementioned embodiments, although the temperature sensor 23 can be configured as a chip-type thermistor or a thermal diode, the disclosed subject matter is not limited thereto, and a different type of temperature sensor may be used.

For example, it is also possible to detect temperature by using a small-sized second LED chip for which a temperature characteristic, namely the relationship between the temperature and the voltage value, is known. In use, a minute current flow can be applied to the second LED chip, and the corresponding voltage value thereof can be detected to determine temperature characteristics.

When using a second LED chip as the temperature sensor, it is possible to mount the second LED chip onto the base simultaneously with the mounting of the main LED chip on the base. Thus, the assembly process can be simplified. It is also conceivable that thermocouple type devices could be used to sense temperature in the lighting device.

The aforementioned embodiments provide white light in a simulated manner, (i.e., through color mixing of the blue light from the blue LED chip with the fluorescence from the phosphor in the phosphor layer). However, the disclosed subject matter is not limited thereto. For example, it is conceivable that an LED light source according to principles of the disclosed subject matter can be configured to output other types/colors of light, or can be configured to output simulated white light produced by different mixtures of colored light (other than blue light mixed with yellow fluorescence).

Further, in the foregoing description of embodiments, there has been described a case of the automobile headlight as the vehicle lighting device. However, the disclosed subject matter is not limited thereto, and may be applied to other lighting devices such as an auxiliary headlight, traffic lights, spot lights, utility lights, brake lights, etc.

As such, according to the disclosed subject matter, the temperatures of the LED chip and the phosphor layer constituting the LED light source can be directly detected by means of the temperature sensor adjacently mounted on the base. Thus, the temperatures thereof can be detected with more accuracy and in substantially real time.

While there has been described what are at present considered to be exemplary embodiments of the disclosed subject matter, it will be understood that various modifications may be made thereto, and it is intended that the appended claims cover such modifications as fall within the true spirit and scope of the disclosed subject matter. All conventional art references described above are herein incorporated in their entirety by reference.

What is claimed is:

1. An LED light source comprising:
    a base;
    at least one LED chip located adjacent the base;
    a phosphor layer located adjacent the LED chip and having a phosphor mixed therein for generating fluorescence when activated by light from the LED chip such that a mixed color light containing the light from the LED chip and the fluorescence from the phosphor is emitted when power is supplied to the LED chip; and
    a temperature detecting element mounted on the base and adjacent the LED chip, the temperature detecting element configured to detect a temperature of the LED chip, wherein the temperature detecting element is a second LED chip that is smaller than the LED chip and has a known temperature characteristic, and wherein, when a minute current is supplied to the second LED chip, the temperature of the LED chip is detected based on a variation of voltage value to the second LED chip.

2. The LED light source according to claim 1, wherein the temperature detecting element is disposed on the base and in the phosphor layer.

3. The LED light source according to claim 1, wherein the temperature detecting element is disposed on the base and outside the phosphor layer.

4. The LED light source according to claim 1, further comprising:
    a power source configured to provide a first current to the LED chip and a second mutually different current to the temperature detecting element; and
    two system wiring patterns formed on the base and configured to supply the first and second currents, respectively.

5. The LED light source according to claim 1, wherein the base is formed of an insulating material having a high coefficient of thermal conductivity and including at least one of a ceramic and a silicon.

6. The LED light source according to claim 1, wherein the base has a surface and is formed of a metal material including at least one of copper and aluminum, the base includes a submount bonded thereon and formed of an insulating material having a high coefficient of thermal conductivity including at least one of silicon and ceramic, and the base includes a wiring pattern formed on the surface of the base.

7. The LED light source according to claim 1, wherein the temperature detecting element is at least one of a miniaturized chip-type thermistor and a thermal diode.

8. A vehicle lighting device comprising the LED light source according to claim 1, comprising:
    a drive control section configured to drive the LED light source, wherein the drive control section is configured to detect a temperature in the vicinity of the LED light source by connection to the temperature detecting element.

9. The vehicle lighting device according to claim 8, wherein the drive control section is configured to adjust a drive current to be fed to the at least one LED chip of the LED light source to an optimal value based on the temperature in the vicinity of the LED light source detected by the temperature detecting element.

10. The vehicle lighting device according to claim 8, wherein the drive control section is configured to detect a temperature abnormality based on the temperature in the vicinity of the LED light source detected by the temperature detecting element.

11. The vehicle lighting device according to claim 10, wherein, the drive control section includes an alarm section configured to provide a notification signal upon detecting the temperature abnormality.

12. The LED light source according to claim 2, further comprising:
    a power source configured to provide a first current to the LED chip and a second mutually different current to the temperature detecting element; and
    two system wiring patterns formed on the base and configured to supply the first and second currents, respectively.

13. The LED light source according to claim 3, further comprising:
    a power source configured to provide a first current to the LED chip and a second mutually different current to the temperature detecting element; and
    two system wiring patterns formed on the base and configured to supply the first and second currents, respectively.

14. A vehicle lighting device comprising the LED light source according to claim 2, comprising:
    a drive control section configured to drive the LED light source, wherein the drive control section is configured to detect a temperature in the vicinity of the LED light source by connection to the temperature detecting element.

15. A vehicle lighting device comprising the LED light source according to claim 3, comprising:
    a drive control section configured to drive the LED light source, wherein the drive control section is configured to detect a temperature in the vicinity of the LED light source by connection to the temperature detecting element.

16. The vehicle lighting device according to claim 9, wherein the drive control section is configured to detect a temperature abnormality based on the temperature in the vicinity of the LED light source detected by the temperature detecting element.

17. The LED light source according to claim 1, wherein the temperature detecting element is configured to detect an ambient temperature of the at least one LED chip.

18. The LED light source according to claim 1, wherein the phosphor layer surrounds the at least one LED chip.

19. The LED light source according to claim 1, wherein the phosphor layer includes a particulate phosphor material mixed therein.

* * * * *